United States Patent
Brooks et al.

(10) Patent No.: US 6,326,242 B1
(45) Date of Patent: *Dec. 4, 2001

(54) SEMICONDUCTOR PACKAGE WITH HEAT SINK AND METHOD OF FABRICATION

(75) Inventors: Mike Brooks, Caldwell; Walter L. Moden, Meridian, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/430,559

(22) Filed: Oct. 29, 1999

Related U.S. Application Data

(62) Division of application No. 08/999,074, filed on Dec. 29, 1997, now Pat. No. 6,049,125.

(51) Int. Cl.[7] ................................................. H01L 21/44
(52) U.S. Cl. ........................ 438/122; 438/111; 438/112; 438/124
(58) Field of Search .................................. 438/122, 110, 438/111, 112, 123, 124, 125, 126, 127

(56) References Cited

U.S. PATENT DOCUMENTS

| | | | |
|---|---|---|---|
| 5,225,710 | * 7/1993 | Westerkamp | 257/713 |
| 5,289,039 | * 2/1994 | Ishida et al. | 257/796 |
| 5,489,805 | * 2/1996 | Hackitt et al. | 257/796 |
| 5,629,561 | 5/1997 | Shin et al. . | |
| 5,653,891 | 8/1997 | Otsuki et al. . | |
| 5,666,003 | 9/1997 | Shibata et al. . | |
| 5,672,548 | 9/1997 | Culmane et al. . | |
| 5,731,632 | * 3/1998 | Kozono | 257/712 |
| 5,818,105 | * 10/1998 | Kouda | 257/796 |
| 5,864,175 | * 1/1999 | Burns | 257/713 |
| 5,872,395 | * 2/1999 | Fujimoto | 257/712 |
| 6,049,125 | 4/2000 | Brooks et al. . | |

* cited by examiner

Primary Examiner—Kevin M. Picardat
(74) Attorney, Agent, or Firm—Stephen A. Gratton

(57) ABSTRACT

A semiconductor package and method for fabricating the package are provided. The package includes a semiconductor die and a heat sink in thermal communication with the die. The heat sink includes one or more pad structures adapted to form bonded connections, and thermal paths to contacts on a substrate. The method includes forming multiple heat sinks on a frame similar to a lead frame, and etching or stamping the pad structures on the heat sink. The frame can then be attached to a leadframe containing encapsulated dice, and the assembly singulated to form separate packages. The packages can be used to form electronic assemblies such as circuit board assemblies and multi chip modules.

34 Claims, 2 Drawing Sheets

SEMICONDUCTOR PACKAGE WITH HEAT SINK AND METHOD OF FABRICATION

CROSS REFERENCE TO RELATED APPLICATIONS

This application is a division of U.S. patent application Ser. No. 08/999,074 filed Dec. 29, 1997 now U.S. Pat. No. 6,049,125.

FIELD OF THE INVENTION

This invention relates generally to semiconductor packaging. More particularly, this invention relates to improved semiconductor packages with heat sinks, and to improved methods for fabricating semiconductor packages with heat sinks.

BACKGROUND OF THE INVENTION

With advances in semiconductor manufacture, the density of integrated circuits on semiconductor dice has increased. The higher circuit density increases the power consumption of the dice, and also the heat generated by the dice. In order to dissipate heat, semiconductor packages are sometimes constructed with heat sinks for dissipating heat. One type of heat sink comprises a metal plate bonded to a face or backside of a semiconductor package. The plate can be surface mounted on the package or embedded in an encapsulant material of the package.

In the fabrication of electronic assemblies, it is sometimes necessary to attach the heat sink of a semiconductor package to a substrate, such as printed circuit board (PCB), or a multi chip module substrate. Electrical connections may also be required between the heat sink and the substrate. For example, some heat sinks require a path to ground. Typically, these electrical connections comprise solder joints bonded to the heat sink, and to corresponding contacts on the substrate. In addition to providing electrical paths, the solder joints provide thermally conductive paths between the heat sink and substrate, for dissipating heat by conduction to the substrate.

One problem with solder joints is that stresses can develop in the solder material due to differences in thermal expansion between the heat sink and substrate. Typically the heat sinks are formed of metals, such as copper, having relatively high coefficients of thermal expansion (CTE). On the other hand, the substrates are typically formed of materials, such as glass filled resins or ceramics, having a different coefficient of thermal expansion.

These stresses can cause cracks which weaken the solder joints. In some situations the joints can loosen and fail. In addition, the cracks can increase the electrical resistivity of the joints, and decrease the thermal conductivity through the joint. In view of the foregoing, improved semiconductor packages with heat sinks, and improved methods for fabricating semiconductor packages and electronic assemblies with heat sinks are required.

SUMMARY OF THE INVENTION

In accordance with the present invention, a semiconductor package, a method for fabricating the package, and electronic assemblies employing the package are provided. The package, simply stated, comprises a semiconductor die in thermal communication with a heat sink. In an illustrative embodiment the package includes an encapsulant, such as molded plastic, and the heat sink is attached to a surface of the encapsulant in thermal communication with the die.

The heat sink includes one or more pad structures on an exterior portion thereof, adapted to provide thermal paths from the heat sink to the substrate. The pad structures also provide an increased surface area, and a topography for forming bonded connections with the substrate. The bonded connections can comprise a metal such as solder, or alternately a thermally conductive polymer. In addition to providing thermal paths, the bonded connections can also provide an electrical function such as a path to ground.

Two main embodiments for the pad structures are provided. In a first embodiment, the pad structures include one, or more, openings formed in the heat sink to a selected depth and in a selected pattern. Representative patterns for the openings include U-shapes, L-shapes, multiple squares or rectangles, donut shapes and squares with solid center portions. The openings can extend completely through the heat sink, or to a selected depth less than a thickness of the heat sink. In addition, the pad structures can be covered with a bonding layer, such as a solder wettable layer or a thermally conductive polymer, to facilitate formation of the bonded connections. In a second embodiment, the pad structures comprises raised members, such as one or more studs, dimples or protrusions, formed in the heat sink, and adapted to provide bonding sites for the bonded connections.

The method for fabricating the semiconductor package includes forming multiple heat sinks on a frame similar to a semiconductor leadframe. In addition, the pad structures can be formed on the heat sinks by etching or stamping the openings in a selected pattern, or by stamping the raised members in a desired configuration. The heat sinks and frame can then be attached to encapsulated semiconductor dice contained on a leadframe. Singulation of the heat sink frame, and package leadframe, forms multiple semiconductor packages.

The semiconductor packages can be used to construct electronic assemblies, such as circuit board assemblies and multi chip modules, by mounting the packages to substrates for the assemblies. During mounting of the semiconductor packages to the substrates, the bonded connections can be formed between the pad structures on the heat sinks, and corresponding contacts on the substrates. Additional bonded connections can also be formed between package leads and other contacts on the substrates.

DETAILED DESCRIPTION OF THE PREFERRED EMBODIMENTS

Figure 1:
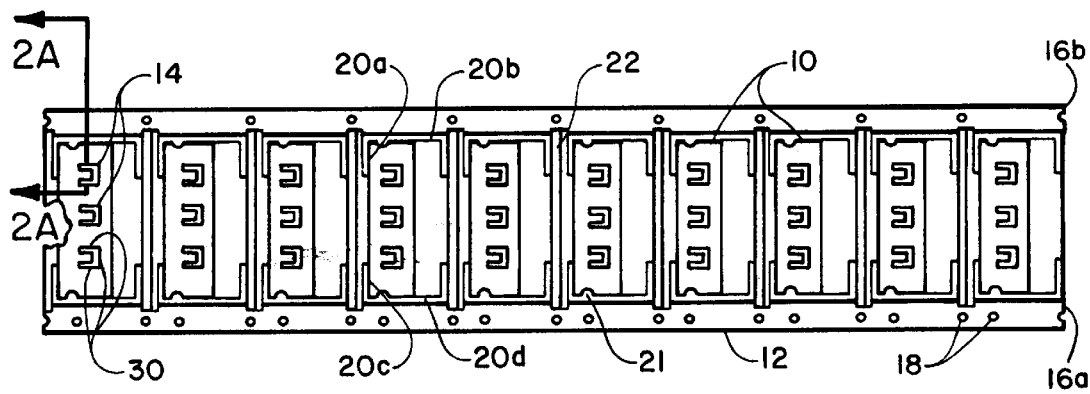
FIG. 1 is a plan view of multiple heat sinks fabricated in accordance with the invention on a frame.
Figure 7:
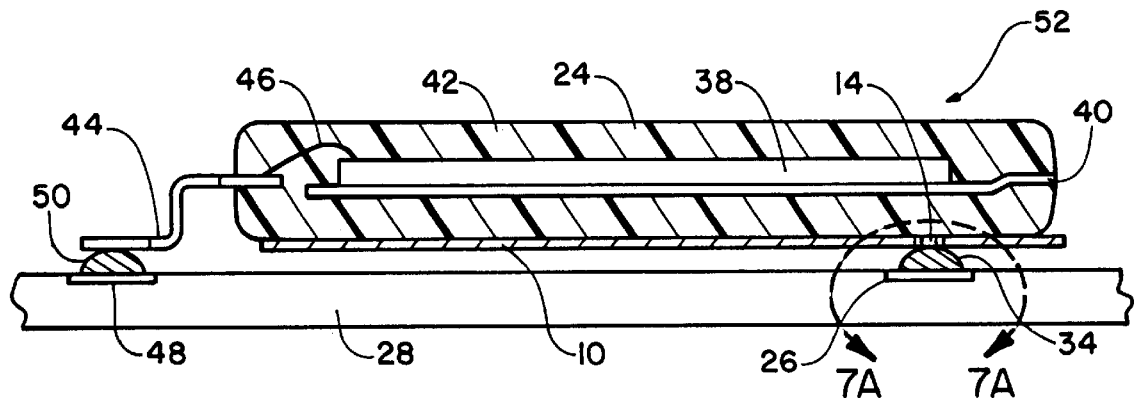
FIG. 7 is an enlarged cross sectional view of a semiconductor package constructed in accordance with the invention mounted to a substrate.

Referring to FIG. 1, heat sinks 10 constructed in accordance with the invention are shown. The heat sinks 10 are fabricated on a frame 12 similar to a lead frame for constructing semiconductor packages. As will be further explained, cutting the frame 12 during a subsequent packaging process singulates the individual heat sinks 10. Each heat sink 10 includes one or more pad structures 14 configured for bonding to a contact 26 (FIG. 7) on a substrate 28 (FIG. 7). The structure and function of the pad structures 14 will become more apparent as the description proceeds.

The heat sinks 10 and frame 12 are fabricated of a material having a high heat conductivity. Preferred materials for the heat sinks 10 and frame 12 include copper, aluminum, silver and alloys of these metals. Other suitable materials include nickel-iron alloys and clad materials such as copper-clad stainless steel. A representative thickness for the heat sinks 10 and frame 12 can be from 5 mils to 10 mils.

The heat sinks 10 and frame 12 can be mechanically stamped, or alternately chemically milled from rolled strip stock. With stamping, progressive dies can be used to mechanically remove unwanted metal from the strip stock to define the heat sinks 10 and frame 12. With chemical milling, photolithography and chemical etchants can be used to define the heat sinks 10 and frame 12 by etching away unwanted areas of metal from the strip stock. Etching can be from one major surface or from opposed major surfaces of the strip stock. The chemical etchants employed will be dependent on the metal. Suitable etchants for chemical milling include ferric chloride, and ammonium persulfate.

The frame 12 includes parallel, spaced, side rails 16a, 16b having multiple indexing holes 18 formed therethrough. The side rails 16a, 16b and holes 18 permit the frame 12 to be handled by automated machinery during fabrication thereof, and during a subsequent fabrication process for a semiconductor package 24 (FIG. 7). Each heat sink 10 comprises a flat plate with a generally rectangular shaped peripheral configuration. The width and length of the heat sinks 10 are dependent on a required size of the semiconductor package 24 (FIG. 7). The frame 12 also includes connecting bars 20a–d that connect each of the heat sinks 10 to the side rails 16a, 16b. The connecting bars 20a–d will subsequently be cut to detach the heat sinks 10 from the side rails 16a, 16b. In addition, each heat sink 10 includes one or more hemispherical cutouts 21 (FIG. 1) which aid in handling the heat sinks 10.

Figure 2A:
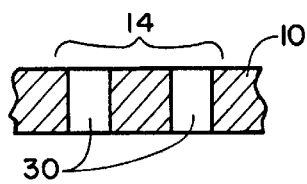
FIG. 2A is an enlarged cross sectional view taken along section line 2A—2A of FIG. 1 showing a pad structure on a heat sink.

Referring to FIG. 2A, an individual pad structure 14 for the heat sinks 10 is illustrated. In the illustrative embodiment there are three pad structures 14 per heat sink 10. Alternately, a greater or lesser number of pad structures 14 per heat sink could be employed.

Figure 2B:
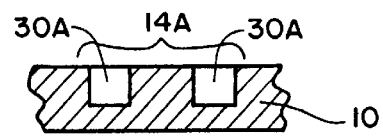
FIG. 2B is an enlarged cross sectional view of an alternate embodiment pad structure.

As shown in FIG. 1, each pad structure 14 comprises one or more openings 30 in the heat sink 10. As shown in FIG. 2A, the openings 30 can be formed completely through the heat sink 10. Alternately, as shown in FIG. 2B, an alternate embodiment pad structure 14A includes one or more openings 30A formed in the heat sink 10 to a selected depth that is less than a thickness of the heat sink 10. In either embodiment, the openings 30, or 30A, can be formed using a chemical milling process as previously described, or alternately using a machining process such as stamping, punching or laser machining.

Figure 4A:
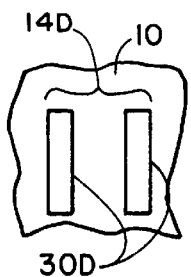
FIGS. 4A–4E are enlarged plan views of alternate embodiment pad structures.
Figure 4B:
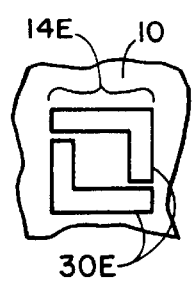
Figure 4C:
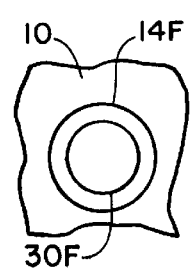
Figure 4D:
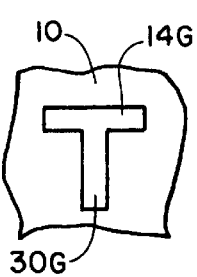
Figure 4E:
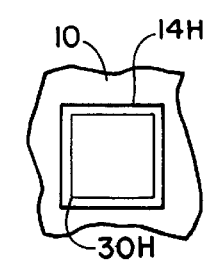

The openings 30 or 30A are also formed in a selected pattern to provide an increased surface area and a bonding topography for forming bonded connections 34 (FIG. 7) to the heat sink 10. In FIG. 1, pad structure 14 includes openings 30 in a U-shaped pattern. In FIG. 4A, pad structure 14D includes having parallel spaced rectangular openings 30D. In FIG. 4B, pad structure 14E includes nested L-shaped openings 30E. In FIG. 4C, pad structure 14F includes donut shaped opening 30F. In FIG. 4D, pad structure 14G includes T-shaped opening 30G. In FIG. 4E, pad structure 14H includes frame shaped opening 30H.

A size of the pad structures 14–14E can be selected as required for a particular application. A representative size range for the pad structures 14–14E (measured from end to end) can be from 0.25 mm to 2.50 mm or greater.

Figure 3A:
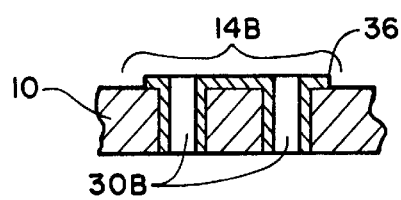
FIG. 3A is an enlarged cross sectional view of an alternate embodiment pad structure equivalent to the embodiment of FIG. 2A with a solder wettable layer.

Referring to FIG. 3A, a pad structure 14B can be formed as previously described for pad structure 14 (FIG. 2A). Pad structure 14B also includes a bonding layer 36 formed within openings 30B and on the surface of the heat sink 10. The bonding layer 36 comprises a material configured to facilitate formation of the bonded connections 34.

For bonded connections 34 formed of solder, the bonding layer 36 can comprise a solder wettable metal. Representative solder wettable metals include solder, Ni, Zn, Cr, and Pd. These metals can be deposited using a suitable deposition process such as electroless deposition, electrochemical deposition, CVD, sputtering, wave soldering or stenciling. The bonding layer 36 can also comprise a thermally conductive polymer such as an anisotropic adhesive or a silver filled silicone deposited using a suitable process such as stenciling or dot shooting through a nozzle.

Figure 3B:
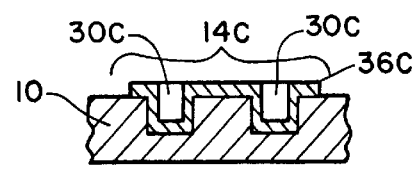
FIG. 3B is an enlarged cross sectional view of an alternate embodiment pad structure equivalent to the embodiment of FIG. 2B with a solder wettable layer.

As shown in FIG. 3B, a pad structure 14C can include openings 30C formed in the heat sink 10 to a depth less than a full thickness of the heat sink. The pad structure 14C can also include a bonding layer 36C formed as previously described for bonding layer 36 (FIG. 3A).

Figure 5A:
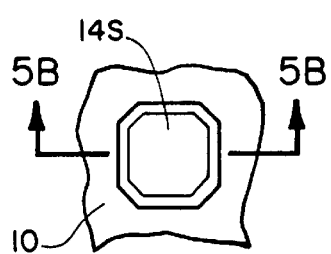
FIG. 5A is an enlarged plan view of an alternate embodiment pad structure comprising a raised member.
Figure 5B:
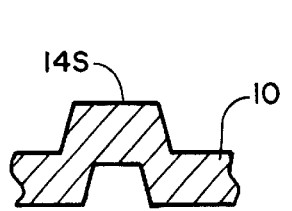
FIG. 5B is a cross sectional view taken along section line 5B—5B of FIG. 5A.
Figure 5C:
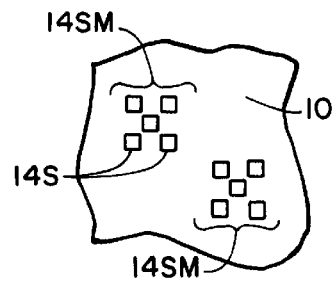
FIG. 5C is an enlarged plan view of an alternate embodiment pad structure comprising multiple raised members.

Referring to FIGS. 5A and 5B, a pad structure 14S comprises a raised member such as a stud, protrusion or dimple, formed in the heat sink 10 by punching or otherwise machining the heat sink 10. A selected width for the pad structure 14S can be from 1.0 mm to 2.50 mm or greater. A selected height for the pad structure 14S can be from 5 mils to 10 mils or greater, measured from the surface of the heat sink 10 to a tip of the pad structure 14S. The pad structure 14S can also be at least partially covered with a bonding layer, substantially similar to the bonding layer 36 (FIG. 3A) and 36C (FIG. 3B) previously described. In addition, as shown in FIG. 5C, a raised pad structure 14SM can include multiple raised members 14S in a desired pattern. The multiple raised members 14S provide a textured bonding site for forming bonded connections.

Figure 6:
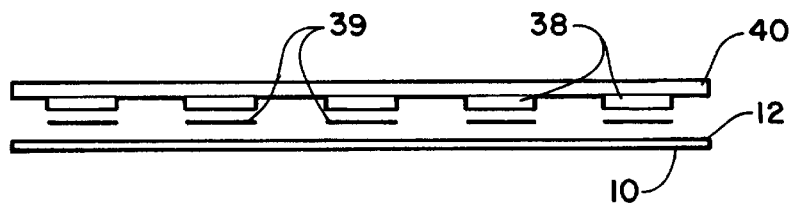
FIG. 6 is a schematic cross sectional view illustrating a step in a method for fabricating semiconductor packages in accordance with the invention.

Referring to FIG. 6, following formation of the heat sinks 10 and frame 12, the heat sinks 10 can be attached to encapsulated semiconductor dice 38 contained on a leadframe 40. The heat sinks 10 can be attached to the encapsulated dice 38 by forming adhesive layers 39 between the encapsulated dice 38 and heat sinks 10. The adhesive layers 39 can comprise an adhesive such as an epoxy, silicone, polyimide or a cyanoacrylate adhesive. Singulation of the lead frame 40 and dice 38 forms separate packages 24 (FIG. 7).

Referring to FIG. 7, an electronic assembly 52 comprising one or more packages 24 mounted to a substrate 28, such as a printed circuit board, is shown. The package 24 includes the encapsulated semiconductor die 38 and the heat sink 10 having one or more pad structures 14 thereon. The package 24 also includes an encapsulant 42, such as an epoxy novolac based molding compound, or other suitable material.

The heat sink 10 functions to dissipate heat generated by the die 38 during operation thereof. The heat sink 10 can be attached directly to an exterior surface of the encapsulant 42 as shown. In this configuration the encapsulant 42 provides a thermally conductive path from the die 38 to the heat sink 10. The heat sink 10 can also be embedded in the encapsulant 42 in direct contact with the leadframe 40 or die 38, but with the pad structures 14 exposed. In addition, separate thermally conductive members (not shown) can be embedded in the encapsulant 42 to improve the thermal path between the die 38 and the heat sink 10. An adhesive for attaching the heat sink 10 to the encapsulant 42 can also be a heat conductive material such as silver filled isotropic adhesive.

The package 24 also includes trimmed and formed leads 44. The leads 44 are illustrated in a gull wing configuration. However, other configurations such as J-bend, flat, or butt joint can also be employed. The leads 44 can be placed in electrical communication with contacts 48 on the substrate 28 using a solder or polymer bonded connection 50.

The package 24 also includes wires 46 that are wire bonded to the leads 44, and to bonding pads (not shown) on the encapsulated die 38. The wires 46 can be wire bonded and the encapsulant 42 molded in a desired shape using conventional processes. Also, concurrently with the encapsulation process the heat sinks 10 and frame 12 (FIG. 6) can be attached to the encapsulated dice 38 and lead frame 40 (FIG. 6).

Figure 7A:
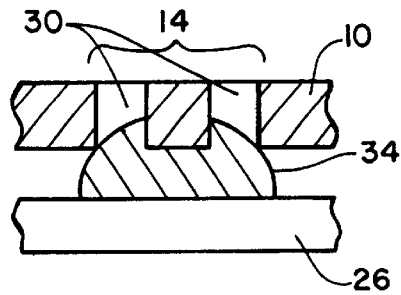
FIG. 7A is an enlarged cross sectional view taken along section line 7A—7A of FIG. 7 showing a pad structure of a heat sink of the package bonded to the substrate with a solder material.

As shown in FIG. 7A, the bonded connections 34 are formed between the pad structures 14 and the contacts 26 on the substrate 28. The bonded connections 34 can comprise a solder alloy such as 95% Pb/5% Sn, 60% Pb/40% Sn, 63% In/37% Sn, or 62% Pb/36% Sn/2% Au. A required volume of solder can be applied using a conventional solder paste/post reflow process. The bonded connections 34 provide thermally conductive paths from the heat sink 10, and allow heat to be dissipated by conduction. For some applications, the bonded connections 34 can also provide an electrically conductive path, such as a path to ground, for the heat sink 10. During formation of the bonded connections 34, some of the solder material can extend into the openings 30 of the pad structures 14 which strengthens the bond.

Alternately in place of solder, the bonded connections 34 can comprise a thermally conductive polymer. Suitable conductive polymers include silver filled isotropic adhesives, and anisotropic adhesives.

The contacts 26 on the substrate 28 can be electrical members such as electrodes, or alternately can merely be thermal bonding sites on substrate 28. Preferably the contacts 26 comprise a bondable metal such as solder, aluminum, copper, silver or gold. The contacts 26 can also comprise a conductive polymer. For some applications the contacts 26 can be omitted and the bonded connections 34 formed directly with the substrate 28 on selected portions thereof.

Figure 7B:
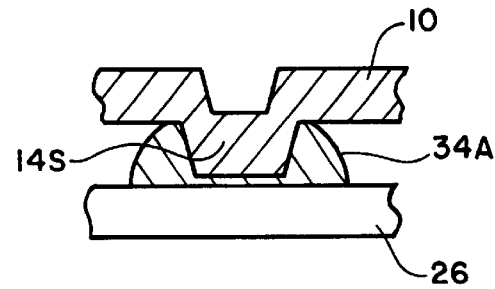
FIG. 7B is an enlarged cross sectional view equivalent to FIG. 7A of an alternate embodiment stud pad structure bonded to a substrate with a polymer material.

FIG. 7B illustrates the raised pad structure 14S with polymer bonded connections 34A. Solder bonded connections could also be employed with the raised pad structure 14S. The raised pad structures 14S anchor the heat sink 10 to the bonded connections 34A and provide an increased surface area for bonding. With polymer bonded connections 34A, the polymer material can be applied in a viscous state to the contacts 26 on the substrate 28. Next, the raised pad structures 14S can be placed in contact with the viscous material, which can then be cured, such as by heating to a required temperature, for a required time period, to form the polymer bonded connections 34A. Although only one raised pad structure 14S per bonded connection 34A is illustrated, multiple raised pad structures could also be used for each bonded connection 34A. In this case the pad structure 14S would provide a textured bonding site.

Figure 8:
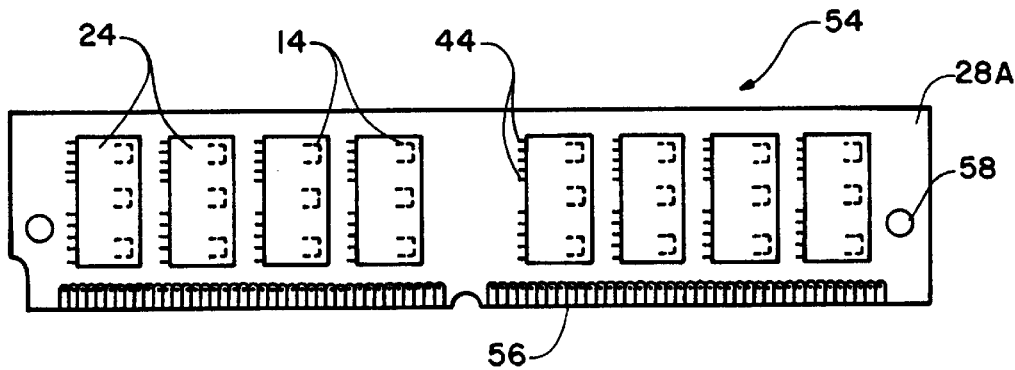
FIG. 8 is a plan view of an electronic assembly including semiconductor packages constructed in accordance with the invention.

Referring to FIG. 8, an electronic assembly in the form of a multi chip module 54 such as a SIMM (single in line memory module) is shown. The multi chip module 54 includes multiple semiconductor packages 24 mounted to a substrate 28A. The substrate 28A includes an edge connector 56 in electrical communication with the leads 44 for the package. The substrate 58 also includes one or more openings 58 for mounting and handling the multi chip module 54. Suitable materials for forming the substrate 28A include silicon, ceramic and glass filled resins (e.g., FR-4). For mounting the packages 24 to the substrate 28A, the pad structures 14 and leads 44 can be bonded to contacts (not shown) on the substrate 28A as previously described.

Thus the invention provides an improved semiconductor package a method for fabricating the package, and improved electronic assemblies employing the package. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor package comprising:

providing a plurality of semiconductor dice on a leadframe;

forming a plurality of heat sinks on a frame, each heat sink including a pad structure comprising at least one opening having a selected depth and configured to provide a bonding site for forming a bonded connection with the heat sink;

attaching the heat sinks on the frame to the dice on the leadframe;

singulating the frame and the leadframe into a plurality of separate packages.

2. The method of claim 1 wherein the forming the heat sinks step comprises etching the opening.

3. The method of claim 1 wherein the forming the heat sinks step comprises stamping the opening.

4. The method of claim 1 wherein the forming the heat sink step comprises depositing a bonding layer on the pad structure.

5. A method for fabricating a semiconductor package comprising:

providing a plurality of semiconductor dice on a leadframe;

forming a plurality of heat sinks on a frame, each heat sink including a pad structure comprising at least one raised member with a selected height configured to provide a bonding site for forming a bonded connection with the heat sink;

attaching the heat sinks on the frame to the dice on the leadframe;

singulating the frame and the leadframe into a plurality of separate packages.

6. The method of claim 5 wherein the forming the heat sinks step comprises stamping the raised member.

7. The method of claim 5 wherein the forming the heat sinks step comprises depositing a bonding layer on the pad structure.

8. A method for fabricating a semiconductor package comprising:

providing an encapsulated semiconductor die;

providing a heat sink for the die comprising a pad structure configured to form a bonded connection between the heat sink and a substrate;

attaching the heat sink to the die; and forming the bonded connection between the heat sink and the substrate.

9. The method of claim 8 wherein the pad structure comprises at least one opening in the heat sink having a selected depth.

10. The method of claim 8 wherein the pad structure comprises at least one raised member on the heat sink having a selected height.

11. The method of claim 8 wherein the die is contained on a leadframe comprising a plurality of dice and the heat sink is contained on a frame comprising a plurality of heat sinks.

12. A method for fabricating semiconductor packages comprising:

providing a plurality of semiconductor dice on a leadframe;

providing a plurality of heat sinks on a frame, each heat sink comprising a pad structure configured to form a bonded connection with a substrate;

attaching the heat sinks on the frame to the dice on the leadframe; and following the attaching step, singulating the frame and the leadframe into the semiconductor packages.

13. The method of claim 12 wherein the semiconductor dice comprise encapsulated dice.

14. The method of claim 12 wherein the pad structure comprises at least one opening.

15. The method of claim 12 wherein the pad structure comprises a plurality of openings.

16. The method of claim 12 wherein the pad structure comprises a plurality of openings in a U-shaped pattern.

17. The method of claim 12 wherein the pad structure comprises parallel spaced openings.

18. The method of claim 12 wherein the pad structure comprises nested L-shaped openings.

19. The method of claim 12 wherein the pad structure comprises a donut shaped opening.

20. The method of claim 12 wherein the pad structure comprises a T-shaped opening.

21. The method of claim 12 wherein the pad structure comprises a frame shaped opening.

22. The method of claim 12 wherein the pad structure comprises at least one raised member.

23. The method of claim 12 wherein the pad structure comprises a stud, a protrusion, or a dimple.

24. The method of claim 12 wherein the pad structure comprises a bonding layer comprising a solder wettable metal.

25. A method for fabricating a semiconductor package comprising:

providing a leadframe and a plurality of semiconductor dice on the leadframe;

providing a frame comprising a plurality of heat sinks comprising metal plates configured for attachment to the dice on the leadframe;

attaching the heat sinks on the frame to the dice on the leadframe; and singulating the frame and the leadframe into a plurality of separate packages including the package.

26. The method of claim 25 wherein the frame comprises parallel spaced side rails, and the heat sinks comprise flat plates attached to the side rails.

27. The method of claim 26 wherein the frame comprises a plurality of connecting bars connecting the heat sinks to the side rails.

28. The method of claim 27 wherein each heat sink comprises at least one pad structure configured for bonding to a substrate.

29. A method for fabricating semiconductor packages comprising:

providing a frame comprising a pair of spaced side rails and a plurality of heat sinks comprising plates connected to the side rails and pad structures on the plates configured to bond the heat sinks to at least one substrate;

providing a semiconductor leadframe;

providing a plurality of encapsulated semiconductor dice on the leadframe;

attaching the heat sinks on the frame to the encapsulated semiconductor dice on the leadframe; and singulating the frame and the leadframe into the packages, each package comprising an encapsulated semiconductor die, a heat sink attached to the die, and a pad structure on the heat sink.

30. The method of claim 29 further comprising bonding at least one package to the at least one substrate.

31. The method of claim 29 further comprising bonding at least one package to the at least one substrate by soldering the pad structure on the at least one package to the at least one substrate.

32. The method of claim 29 wherein the frame and the heat sinks comprise a metal selected from the group consisting of copper, aluminum silver, and alloys thereof.

33. The method of claim 29 wherein the frame and the heat sinks comprise a metal selected from the group consisting of nickel-iron alloys, and copper-clad steel.

34. The method of claim 29 wherein the pad structures comprise openings or raised members.

* * * * *